(12) United States Patent
Han et al.

(10) Patent No.: US 12,349,498 B2
(45) Date of Patent: Jul. 1, 2025

(54) SOLAR CELL AND MANUFACTURING METHOD THEREOF, PHOTOVOLTAIC MODULE, AND PHOTOVOLTAIC SYSTEM

(71) Applicant: TRINA SOLAR CO., LTD., Changzhou (CN)

(72) Inventors: Binglun Han, Changzhou (CN); Daming Chen, Changzhou (CN); Guangtao Yang, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/768,660

(22) Filed: Jul. 10, 2024

(65) Prior Publication Data

US 2024/0363776 A1    Oct. 31, 2024

(30) Foreign Application Priority Data

Aug. 25, 2023   (CN) .......................... 202311078019.3

(51) Int. Cl.
  *H10F 77/14* (2025.01)
  *H10F 71/10* (2025.01)
  *H10F 77/30* (2025.01)

(52) U.S. Cl.
  CPC ......... *H10F 77/1462* (2025.01); *H10F 71/10* (2025.01); *H10F 71/103* (2025.01); *H10F 77/315* (2025.01)

(58) Field of Classification Search
  CPC ....... H01L 31/035245; H01L 31/02168; H01L 31/202; H01L 31/208; H10F 77/1462; H10F 77/315; H10F 71/103; H10F 71/10
  See application file for complete search history.

(56) References Cited

U.S. PATENT DOCUMENTS

| 8,686,283 B2 | 4/2014 | Heng et al. |
| 10,453,983 B2 | 10/2019 | Lee et al. |

(Continued)

FOREIGN PATENT DOCUMENTS

| CN | 103985778 A | 8/2014 |
| CN | 104134707 B | 5/2016 |

(Continued)

OTHER PUBLICATIONS

Notice of Reasons for Refusal, Japanese Patent Application No. 2024-092432, dated Jul. 19, 2024.

(Continued)

*Primary Examiner* — Sadie White
(74) *Attorney, Agent, or Firm* — MARSHALL, GERSTEIN & BORUN LLP

(57) ABSTRACT

A solar cell and a manufacturing method thereof, a photovoltaic module, and a photovoltaic system. The manufacturing method includes: providing a substrate; and dividing a second surface of the substrate into a first region, a second region, and an isolation region; sequentially stacking a first tunnel oxide layer, a first intrinsic amorphous silicon layer, a second tunnel oxide layer, and a second intrinsic amorphous silicon layer on the second surface of the substrate; removing the second intrinsic amorphous silicon layer and the second tunnel oxide layer located in the second region; doping the first intrinsic amorphous silicon layer and the second intrinsic amorphous silicon layer located in the first region with a first element, to obtain a first doped layer and a second doped layer respectively; doping the first intrinsic amorphous silicon layer located in the second region with a second element, to obtain a third doped layer; and forming an isolation structure in the isolation region, to isolate the first tunnel oxide layer located in the first region from the first tunnel oxide layer located in the second region and (Continued)

isolate the first doped layer and the second doped layer located in the first region from the third doped layer located in the second region.

14 Claims, 8 Drawing Sheets

(56) References Cited

U.S. PATENT DOCUMENTS

| | | | | |
|---|---|---|---|---|
| 2007/0256728 | A1* | 11/2007 | Cousins | H01L 31/068 |
| | | | | 136/252 |
| 2013/0247965 | A1* | 9/2013 | Swanson | H01L 31/0747 |
| | | | | 257/E31.13 |
| 2014/0096820 | A1 | 4/2014 | Neumayer et al. | |
| 2014/0096821 | A1* | 4/2014 | Chen | H01L 31/0352 |
| | | | | 438/96 |
| 2015/0007879 | A1* | 1/2015 | Kwon | H10F 71/1221 |
| | | | | 438/96 |
| 2015/0162483 | A1* | 6/2015 | Weidman | H01L 31/022441 |
| | | | | 136/258 |
| 2016/0284896 | A1* | 9/2016 | Westerberg | H01L 31/022441 |
| 2020/0105956 | A1* | 4/2020 | Smith | H01L 31/1804 |

FOREIGN PATENT DOCUMENTS

| | | |
|---|---|---|
| CN | 106328735 A | 1/2017 |
| CN | 108987488 A | 12/2018 |
| CN | 110600577 A | 12/2019 |
| CN | 111463306 A | 7/2020 |
| CN | 113964216 A | 1/2022 |
| CN | 115513308 A | 12/2022 |
| CN | 115832065 A | 3/2023 |
| CN | 116190483 A | 5/2023 |
| CN | 116387370 A | 7/2023 |
| CN | 116417522 A | 7/2023 |
| CN | 219371038 U | 7/2023 |
| JP | 2005101151 A | 4/2005 |
| JP | 2015514314 A | 5/2015 |
| JP | 2021145056 A | 9/2021 |
| WO | WO-2023045347 A1 | 3/2023 |
| WO | WO-2023050824 A1 | 4/2023 |
| WO | WO-2023123809 A1 | 7/2023 |

OTHER PUBLICATIONS

European Search Report, European Patent Application No. 22871100.8, dated Apr. 2, 2024.

Supplemental Search Report, Chinese Patent Application No. 2021116678058, dated Feb. 26, 2024.

Chinese Office Action, Chinese Patent Application No. 202311078019.3, dated Oct. 13, 2023.

Decision of Grant, Chinese Patent Application No. 202311078019.3, dated Oct. 26, 2023.

European Search Report, European Patent Application No. 24182030.7, dated Jan. 31, 2025.

Second Office Action, Japanese Patent Application No. 2024-092432, dated Nov. 26, 2024.

* cited by examiner

SOLAR CELL AND MANUFACTURING METHOD THEREOF, PHOTOVOLTAIC MODULE, AND PHOTOVOLTAIC SYSTEM

CROSS-REFERENCE TO RELATED APPLICATION

This application claims priority to Chinese patent application No. 202311078019.3, filed on Aug. 25, 2023, and titled "SOLAR CELL AND MANUFACTURING METHOD THEREOF, PHOTOVOLTAIC MODULE, AND PHOTOVOLTAIC SYSTEM", the content of which is hereby incorporated herein in its entirety by reference.

TECHNICAL FIELD

The present disclosure relates to the field of photovoltaic cell technologies, and in particular, to a solar cell and a manufacturing method thereof, a photovoltaic module, and a photovoltaic system.

BACKGROUND

A solar cell, also known as a photovoltaic cell, is a semiconductor device that converts light energy of sun directly into electrical energy. Since the solar cell is a green and environment-friendly product that may not cause environmental pollution and solar energy is a renewable resource, solar cells are new cells with a broad development prospect.

Electrodes of an interdigitated back contact (IBC) cell are located on a back surface of the cell, which can reduce occlusion of a light-receiving surface of the cell and improve conversion efficiency of the cell, gradually becoming a main research and development direction of industrialized high-efficiency cells. A tunnel oxide passivated contact (TOPCon) cell has a passivated contact structure of a tunnel oxide layer and a doped polysilicon layer, which can effectively reduce rates of contact and recombination between a silicon wafer surface and metal. A tunnel back contact (TBC) cell that superimposes TOPCon cell and IBC cell technologies has higher efficiency and has gradually become a research hotspot.

In the related art, during manufacturing of the TBC cell, when passivated contact structures are manufactured in a P region and an N region of a backlight surface of a silicon substrate respectively, more process steps are required, which results in high manufacturing costs of the cell and high mass production costs of the cell and is not conducive to mass production of the cell.

SUMMARY

Based on this, the present disclosure provides a solar cell and a manufacturing method thereof, a photovoltaic module, and a photovoltaic system, which can reduce steps of a manufacturing process of the cell and reduce manufacturing costs of the cell, thereby facilitating mass production of the cell and reducing mass production costs of the cell.

An embodiment of a first aspect of the present disclosure provides a manufacturing method for a solar cell, including: S1. providing a substrate, wherein the substrate has a first surface and a second surface arranged oppositely, and the second surface is divided into a first region, a second region, and an isolation region located between the first region and the second region; S2. sequentially stacking a first tunnel oxide layer, a first intrinsic amorphous silicon layer, a second tunnel oxide layer, and a second intrinsic amorphous silicon layer on the second surface of the substrate and in a direction away from the substrate; S3. removing the second intrinsic amorphous silicon layer and the second tunnel oxide layer located in the second region; S4. doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer; and S5. forming an isolation structure in the isolation region, to isolate the first tunnel oxide layer located in the first region from the first tunnel oxide layer located in the second region and isolate the first doped layer and the second doped layer located in the first region from the third doped layer located in the second region.

In some embodiments, prior to step S3, the method further includes: S3a. sequentially stacking a doping source layer and a first protective layer on a side of the second intrinsic amorphous silicon layer facing away from the substrate, wherein the doping source layer is configured to provide the first element required for doping.

In some embodiments, step S3 specifically includes: S310a. removing, by laser, the first protective layer, the doping source layer, and part of the second intrinsic amorphous silicon layer facing away from the second tunnel oxide layer that are located in the second region; and S320a. removing, by a wet process, the remaining second intrinsic amorphous silicon layer located in the second region and adjacent to the second tunnel oxide layer and the second tunnel oxide layer located in the second region.

In some embodiments, step S320a specifically includes: removing, by the wet process, the remaining second intrinsic amorphous silicon layer located in the second region and adjacent to the second tunnel oxide layer; forming a mask layer on a side of the first protective layer located in the first region facing away from the substrate; removing, by the wet process, the second tunnel oxide layer located in the second region; and removing the mask layer.

In some embodiments, step S4 specifically includes: at a preset temperature, doping, by the doping source layer, the first intrinsic amorphous silicon layer and the second intrinsic amorphous silicon layer with the first element for a preset duration, to obtain the first doped layer and the second doped layer respectively; and doping the first intrinsic amorphous silicon layer located in the second region with the second element, to obtain the third doped layer.

In some embodiments, subsequent to step S4, the method further includes: removing the doping source layer and the first protective layer.

In some embodiments, prior to step S3, the method further includes: S3b. forming a second protective layer on a side of the second intrinsic amorphous silicon layer facing away from the substrate.

In some embodiments, step S3 specifically includes: S310b. removing, by laser, the second protective layer located in the second region and part of the second intrinsic amorphous silicon layer facing away from the second tunnel oxide layer; and S320b. removing, by a wet process, the remaining second intrinsic amorphous silicon layer located in the second region and adjacent to the second tunnel oxide layer and the second tunnel oxide layer located in the second region.

In some embodiments, step S320b specifically includes: removing, by the wet process, the remaining second intrinsic amorphous silicon layer located in the second region and adjacent to the second tunnel oxide layer; forming a mask layer on a side of the second protective layer located in the first region facing away from the substrate; removing, by the wet process, the second tunnel oxide layer located in the second region; and removing the mask layer.

In some embodiments, step S4 specifically includes: doping the first intrinsic amorphous silicon layer located in the second region with the second element, to obtain the third doped layer; forming a third protective layer on a side of the third doped layer facing away from the substrate; and removing the second protective layer located in the first region, and doping the first intrinsic amorphous silicon layer and the second intrinsic amorphous silicon layer located in the first region with the first element, to obtain the first doped layer and the second doped layer.

In some embodiments, subsequent to step S4, the method further includes: removing the third protective layer.

In some embodiments, subsequent to step S5, the method further includes: forming a first passivation antireflection layer on a side of the second doped layer and the third doped layer facing away from the substrate, the first passivation antireflection layer covering at least a surface on the side of the second doped layer and the third doped layer facing away from the substrate; and forming a second passivation antireflection layer on the first surface of the substrate.

In some embodiments, the method further includes: forming a first electrode on a side of the first passivation antireflection layer located in the first region facing away from the substrate, the first electrode being connected to the second doped layer; and forming a second electrode on a side of the first passivation antireflection layer located in the second region facing away from the substrate, the second electrode being connected to the third doped layer.

In some embodiments, thicknesses of the first tunnel oxide layer and the second tunnel oxide layer both range from 1 nm to 2 nm; and thicknesses of the first doped layer, the second doped layer, and the third doped layer all range from 50 nm to 500 nm.

An embodiment of a second aspect of the present disclosure provides a solar cell, including: a substrate having a first surface and a second surface arranged oppositely; the second surface including a first region, a second region, and an isolation region located between the first region and the second region; a first tunnel oxide layer, a first doped layer, a second tunnel oxide layer, and a second doped layer located in the first region and sequentially stacked in a direction away from the substrate; the first tunnel oxide layer and a third doped layer located in the second region and sequentially stacked in a direction away from the substrate; and an isolation structure located in the isolation region, the isolation structure being configured to isolate the first tunnel oxide layer located in the first region from the first tunnel oxide layer located in the second region, and the isolation structure being further configured to isolate the first doped layer and the second doped layer located in the first region from the third doped layer located in the second region.

In some embodiments, the isolation structure includes an isolation groove, the isolation groove running through the first tunnel oxide layer, the first doped layer, the second tunnel oxide layer, the second doped layer, and the third doped layer along a first direction, the first direction being perpendicular to a plane where the substrate is located.

An embodiment of a third aspect of the present disclosure provides a photovoltaic module, including the solar cell described in any one of the above embodiments in the second aspect.

An embodiment of a fourth aspect of the present disclosure provides a photovoltaic system, including the photovoltaic module described in any one of the above embodiments in the third aspect.

In the manufacturing method for a solar cell described above, a first tunnel oxide layer, a first intrinsic amorphous silicon layer, a second tunnel oxide layer, and a second intrinsic amorphous silicon layer are sequentially stacked on the substrate, and after the second intrinsic amorphous silicon layer and the second tunnel oxide layer located in the second region are removed, the first intrinsic amorphous silicon layer and the second intrinsic amorphous silicon layer located in the first region are doped with a first element, to obtain a first doped layer and a second doped layer; and the first intrinsic amorphous silicon layer located in the second region is doped with a second element, to obtain a third doped layer, and an isolation structure is formed in the isolation region, so as to form passivated contact structures respectively located in the first region and the second region on the second surface of the substrate, which reduces process steps required for manufacturing the passivated contact structures respectively in the first region and the second region of the substrate, thereby reducing steps of a manufacturing process of the cell, reducing manufacturing costs of the cell, facilitating mass production of the cell, and reducing mass production costs of the cell.

In addition, when the first intrinsic amorphous silicon layer and the second intrinsic amorphous silicon layer located in the first region are doped with the first element, since the first element is required to diffuse to a first intrinsic polysilicon layer through the second tunnel oxide layer, the second tunnel oxide layer has a certain blocking effect, which can prevent excessive diffusion of the first element to the first intrinsic polysilicon layer, so that doping concentration of the first doped layer can be less than doping concentration of the second doped layer, thereby reducing parasitic absorption of light by the first doped layer and improving efficiency of the cell. During subsequent manufacturing of electrodes, an ohmic contact effect between the second doped layer and the electrodes can be improved, thereby improving efficiency and reliability of the cell. In addition, the second tunnel oxide layer has a certain reflection effect on light, thereby improving light utilization and further improving the efficiency of the cell.

Figure 1:
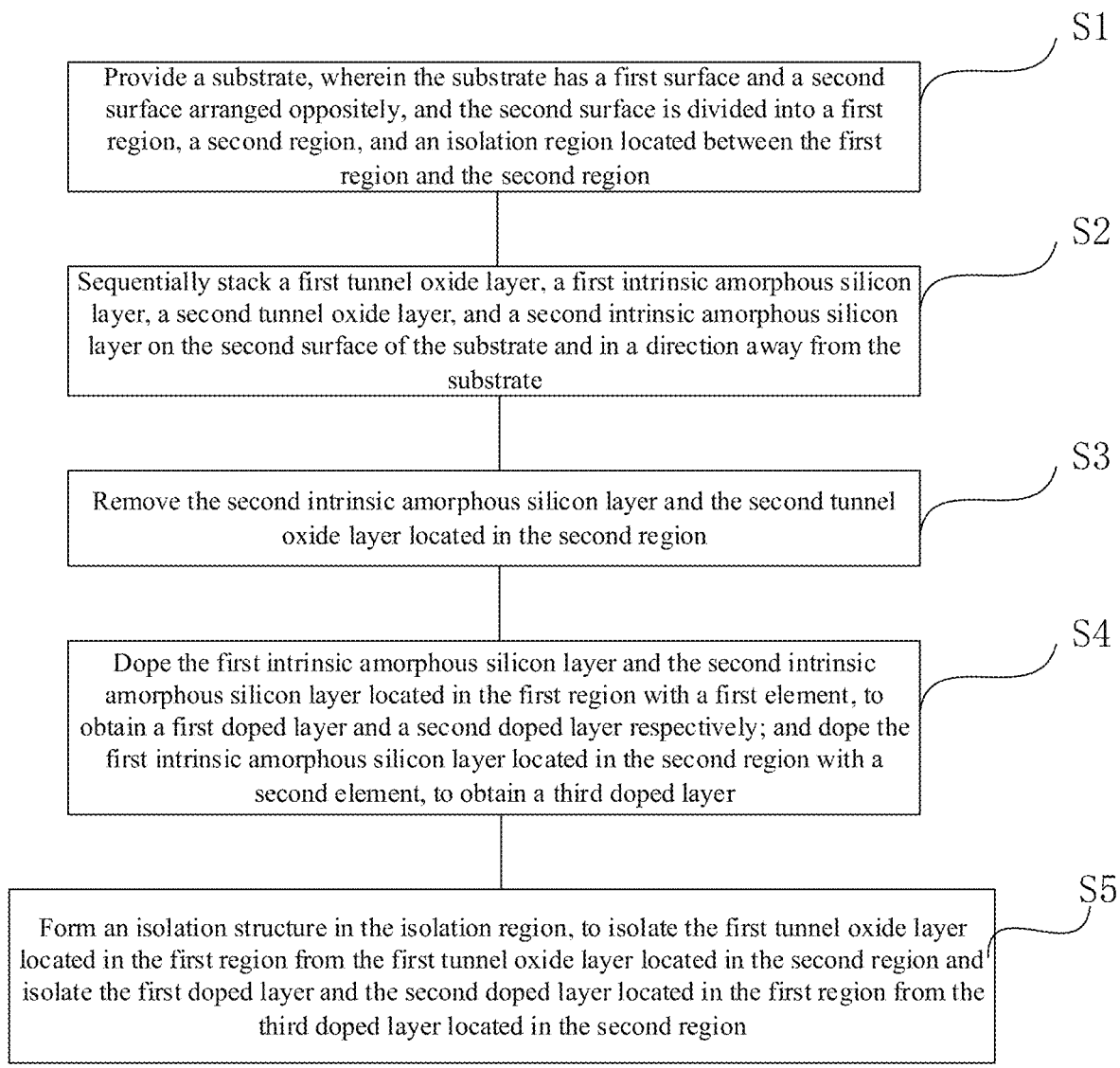
FIG. 1 is a flowchart of a manufacturing method for a solar cell according to some embodiments of the present disclosure.

Reference signs: 110. substrate; 111. first surface; 112. second surface; 112*a*. first region; 112*b*. second region; 112*c*. isolation region; 120. first tunnel oxide layer; 130. first intrinsic amorphous silicon layer; 130*a*. first doped layer; 130*b*. second doped layer; 140. second tunnel oxide layer; 150. second intrinsic amorphous silicon layer; 150*a*. third doped layer; 160. doping source layer; 170. first protective layer; 180. second protective layer; 190. isolation structure; 200*a*. first passivation antireflection layer; 200*b*. second passivation antireflection layer; 210. first electrode 220. second electrode; X. first direction.

DETAILED DESCRIPTION

In order to make the above objectives, features, and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by the specific implementation disclosed below.

In the description of the present disclosure, the orientation or position relationships indicated by the terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", and the like are based on the orientation or position relationships shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Thus, the features defined with "first" and "second" may explicitly or implicitly include one or more features. In the description of the present disclosure, "a plurality of" means two or more, such as two or three, unless otherwise defined explicitly and specifically.

In the present disclosure, unless otherwise specified and defined explicitly, the terms "install", "connect", "join", and "fix" should be understood in a broad sense. For example, they may refer to a fixed connection, a detachable connection, or an integral connection; may refer to a mechanical connection or electrical connection; and may refer to a direct connection, an indirect connection via an intermediate medium, an internal connection between two elements, or interaction between two elements. Those of ordinary skill in the art can understand specific meanings of these terms in the present disclosure according to specific situations.

In the present disclosure, unless otherwise specified and defined explicitly, the expression a first feature being "on" or "under" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "below", "underneath" or "under" the second feature may be the case that the first feature is directly underneath or obliquely underneath the second feature, or only means that the level of the first feature is lower than that of the second feature.

It should be noted that when one element is referred to as "fixed to" or "arranged on" another element, it may be directly disposed on the another element or an intermediate element may exist. When one element is considered to be "connected to" another element, it may be directly connected to the another element or an intermediate element may co-exist. The terms "vertical", "horizontal", "upper", "lower", "left", "right" and similar expressions used herein are for illustrative purposes only and do not represent the only implementation.

FIG. 1 illustrates a manufacturing method for a solar cell according to some embodiments of the present disclosure. Referring to FIG. 1, an embodiment of a first aspect of the present disclosure provides a manufacturing method for a solar cell, including the following steps.

A substrate 110 is provided. The substrate 110 has a first surface 111 and a second surface 112 arranged oppositely, and the second surface 112 is divided into a first region 112*a*, a second region 112*b*, and an isolation region 112*c* located between the first region and the second region.

Specifically, the substrate 110 may be a P-type silicon substrate 110 or an N-type silicon substrate 110. The first surface 111 may be a light-receiving surface, and the second surface 112 may be a backlight surface.

The first surface 111 and the second surface 112 of the substrate 110 may be polished with a chemical solution prepared from deionized water, KOH, and a polishing additive, which can ensure flatness of a region on the substrate 110 in contact with tunnel oxide layers (a first tunnel oxide layer 120 and a second tunnel oxide layer 140) in subsequent steps, so as to facilitate improvement of flatness and uniformity of the first tunnel oxide layer 120, the second tunnel oxide layer 140, a first intrinsic polysilicon layer, and a second intrinsic polysilicon layer subsequently manufactured, thereby improving a passivation effect of a passivation contact structure formed on the substrate 110.

In S2, a first tunnel oxide layer 120, a first intrinsic amorphous silicon layer 130, a second tunnel oxide layer 140, and a second intrinsic amorphous silicon layer 150 are sequentially staked on the second surface 112 of the substrate 110 and in a direction away from the substrate 110.

Specifically, the first tunnel oxide layer 120, the first intrinsic amorphous silicon layer 130, the second tunnel oxide layer 140, and the second intrinsic amorphous silicon layer 150 may be sequentially staked on the second surface 112 of the substrate 110 by low pressure chemical vapor deposition, and may certainly be formed in other deposition manners, which is not specially limited in the present disclosure.

In S3, the second intrinsic amorphous silicon layer 150 and the second tunnel oxide layer 140 located in the second region 112*b* are removed.

Specifically, the second intrinsic amorphous silicon layer 150 and the second tunnel oxide layer 140 located in the second region 112b may be removed by means of one or more of laser, chemical etching, or photoetching. Preferably, laser and chemical etching are combined to remove the second intrinsic amorphous silicon layer 150 and the second tunnel oxide layer 140 located in the second region 112b, which reduces damage to the first intrinsic amorphous silicon layer 130 during the removal, thereby improving performance of a third doped layer 150a obtained by doping and helping improve efficiency of the cell.

In S4, the first intrinsic amorphous silicon layer 130 and the second intrinsic amorphous silicon layer 150 located in the first region 112a are doped with a first element, to obtain a first doped layer 130a and a second doped layer 130b respectively; and the first intrinsic amorphous silicon layer 130 located in the second region 112b is doped with a second element, to obtain a third doped layer 150a.

The first element may be boron, and the second element may be phosphorus. By doping the first intrinsic amorphous silicon layer 130 and the second intrinsic amorphous silicon layer 150 located in the first region 112a with boron, doping types of the first doped layer 130a and the second doped layer 130b obtained by doping may be consistent. Since a diffusion coefficient of boron in the intrinsic amorphous silicon layers (the first intrinsic amorphous silicon layer and the second intrinsic amorphous silicon layer) is much less than a diffusion coefficient of phosphorus and the second tunnel oxide layer has a certain blocking effect, the first doped layer 130a with low doping concentration and the second doped layer 130b with high doping concentration can be obtained, thereby reducing parasitic absorption of light by the first doped layer 130a and improving efficiency of the cell. During subsequent manufacturing of electrodes, an ohmic contact effect between the second doped layer 130b and the electrodes can be improved, thereby improving efficiency and reliability of the cell.

In S5, an isolation structure 190 is formed in the isolation region 112c, to isolate the first tunnel oxide layer 120 located in the first region 112a from the first tunnel oxide layer 120 located in the second region 112b and isolate the first doped layer 130a and the second doped layer 130b located in the first region 112a from the third doped layer 150a located in the second region 112b, so as to prevent recombination and improve efficiency of the cell.

In the manufacturing method for a solar cell described above, a first tunnel oxide layer 120, a first intrinsic amorphous silicon layer 130, a second tunnel oxide layer 140, and a second intrinsic amorphous silicon layer 150 are sequentially stacked on the substrate 110, and after the second intrinsic amorphous silicon layer 150 and the second tunnel oxide layer 140 located in the second region 112b are removed, the first intrinsic amorphous silicon layer 130 and the second intrinsic amorphous silicon layer 150 located in the first region 112a are doped with a first element, to obtain a first doped layer 130a and a second doped layer 130b; and the first intrinsic amorphous silicon layer 130 located in the second region 112b is doped with a second element, to obtain a third doped layer 150a, and an isolation structure 190 is formed in the isolation region 112c, so as to form passivated contact structures respectively located in the first region 112a and the second region 112b on the second surface 112 of the substrate 110, which reduces process steps required for manufacturing the passivated contact structures respectively in the first region 112a and the second region 112b of the substrate 110, thereby reducing steps of a manufacturing process of the cell, reducing manufacturing costs of the cell, facilitating mass production of the cell, and reducing mass production costs of the cell.

In addition, when the first intrinsic amorphous silicon layer 130 and the second intrinsic amorphous silicon layer 150 located in the first region 112a are doped with the first element, since the first element is required to diffuse to the first intrinsic polysilicon layer through the second tunnel oxide layer 140, the second tunnel oxide layer 140 has a certain blocking effect, which can prevent excessive diffusion of the first element to the first intrinsic polysilicon layer, so that doping concentration of the first doped layer 130a can be less than doping concentration of the second doped layer 130b, thereby reducing parasitic absorption of light by the first doped layer 130a and improving efficiency of the cell. During subsequent manufacturing of electrodes, an ohmic contact effect between the second doped layer 130b and the electrodes can be improved, thereby improving efficiency and reliability of the cell. In addition, the second tunnel oxide layer 140 has a certain reflection effect on light, thereby improving light utilization and further improving the efficiency of the cell.

Figure 2:
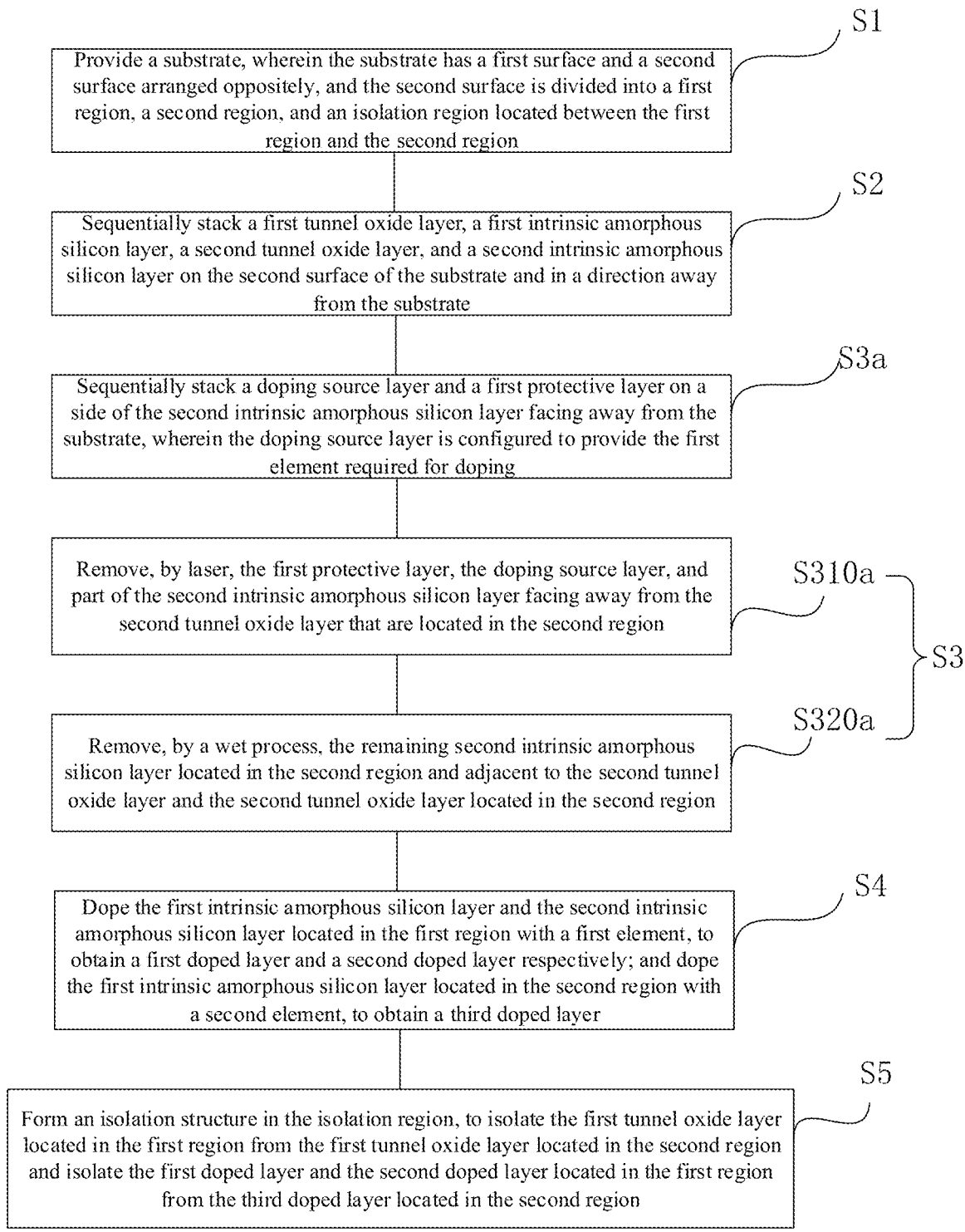
FIG. 2 is a first flowchart of the manufacturing method for a solar cell according to some embodiments of the present disclosure.
Figure 3:
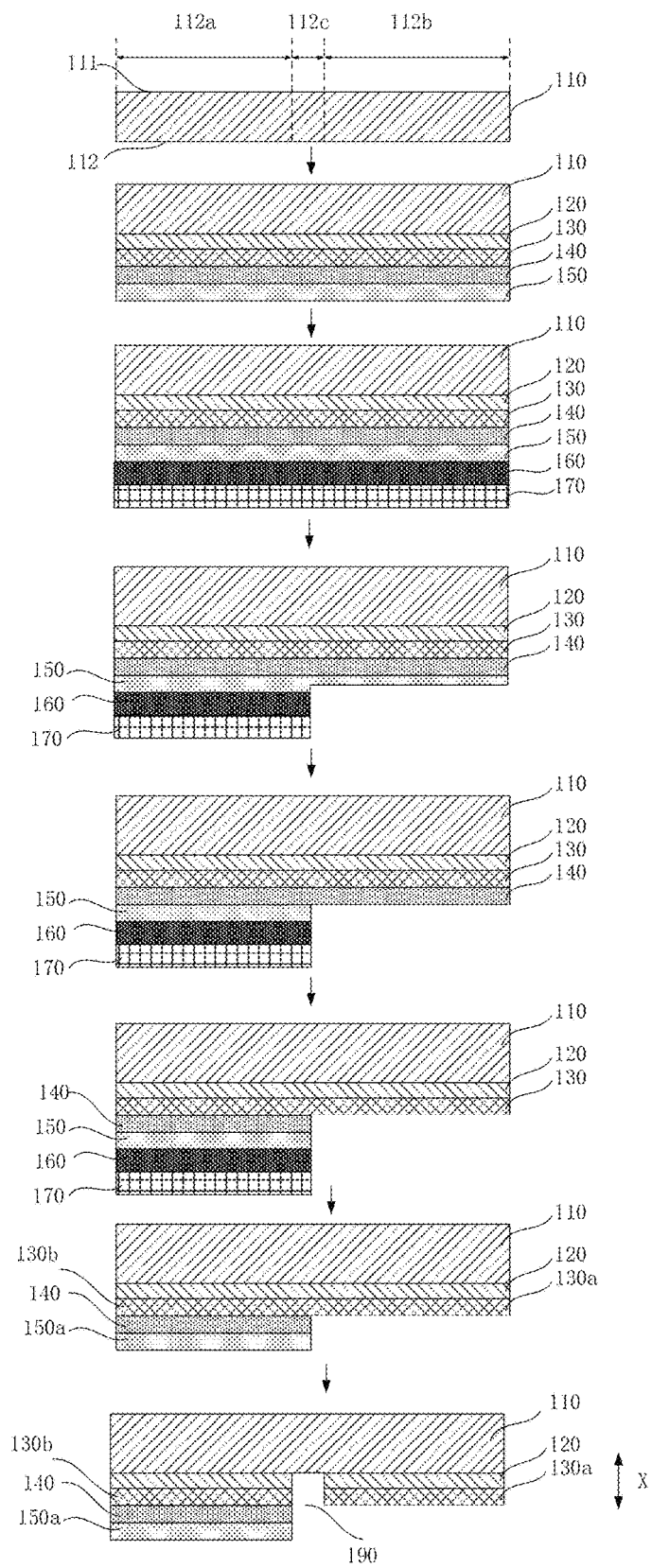
FIG. 3 is a first process flowchart corresponding to the first flowchart in FIG. 2.

Referring to FIG. 2 and FIG. 3 together, in some embodiments, prior to step S3, the method further includes the following step.

In S3a, a doping source layer 160 and a first protective layer 170 are sequentially stacked on a side of the second intrinsic amorphous silicon layer 150 facing away from the substrate 110, wherein the doping source layer 160 is configured to provide the first element required for doping.

The doping source layer 160 may be a boron source layer. For example, a borosilicate glass layer is formed on the side of the second intrinsic amorphous silicon layer 150 away from the substrate 110 by atmospheric pressure chemical vapor deposition (APCVD). In another example, a pure boron layer is formed on the side of the second intrinsic amorphous silicon layer 150 away from the substrate 110 by boron tube expansion. The first protective layer 170 may be at least one of a silicon oxide layer, silicon oxynitride, and silicon nitride. The first protective layer 170 may be manufactured by APCVD or manufactured by plasma enhanced chemical vapor deposition (PECVD). A thickness of the first protective layer 170 ranges from 50 nm to 100 nm.

In this embodiment, the doping source layer 160 and the first protective layer 170 are sequentially stacked on the side of the second intrinsic amorphous silicon layer 150 away from the substrate 110, and subsequently the second intrinsic amorphous silicon layer 150 and the first intrinsic amorphous silicon layer 130 may be conveniently doped with the first element through the doping source layer 160, to obtain the first doped layer 130a and the second doped layer 130b with a same doping type. The first protective layer 170 may subsequently play a protective and blocking role.

Referring to FIG. 2 and FIG. 3 together, in some embodiments, step S3 specifically includes the following steps.

In S310a, the first protective layer 170, the doping source layer 160, and part of the second intrinsic amorphous silicon layer 150 facing away from the second tunnel oxide layer 140 that are located in the second region 112b are removed by laser.

In S320a, the remaining second intrinsic amorphous silicon layer 150 located in the second region 112b and adjacent to the second tunnel oxide layer 140 and the second tunnel oxide layer 140 located in the second region 112b are removed by a wet process.

In this embodiment, the first protective layer 170, the doping source layer 160, and part of the second intrinsic amorphous silicon layer 150 facing away from the second tunnel oxide layer 140 that are located in the second region 112b are removed by laser; and the remaining second intrinsic amorphous silicon layer 150 located in the second region 112b and adjacent to the second tunnel oxide layer 140 and the second tunnel oxide layer 140 located in the second region 112b are removed by the wet process. During the removal by laser, the second intrinsic amorphous silicon layer 150 serves as a sacrificial layer and can absorb laser energy, and the second tunnel oxide layer 140 can serve as a barrier layer, which can block transmission of laser energy and reduce damage of the laser to the first intrinsic amorphous silicon layer 130. The remaining second intrinsic amorphous silicon layer 150 and the second tunnel oxide layer 140 are removed by the wet process, which can prevent damage to the first intrinsic amorphous silicon layer 130, thereby ensuring performance of the third doped layer 150a obtained by doping and improving efficiency of the cell.

Figure 4:
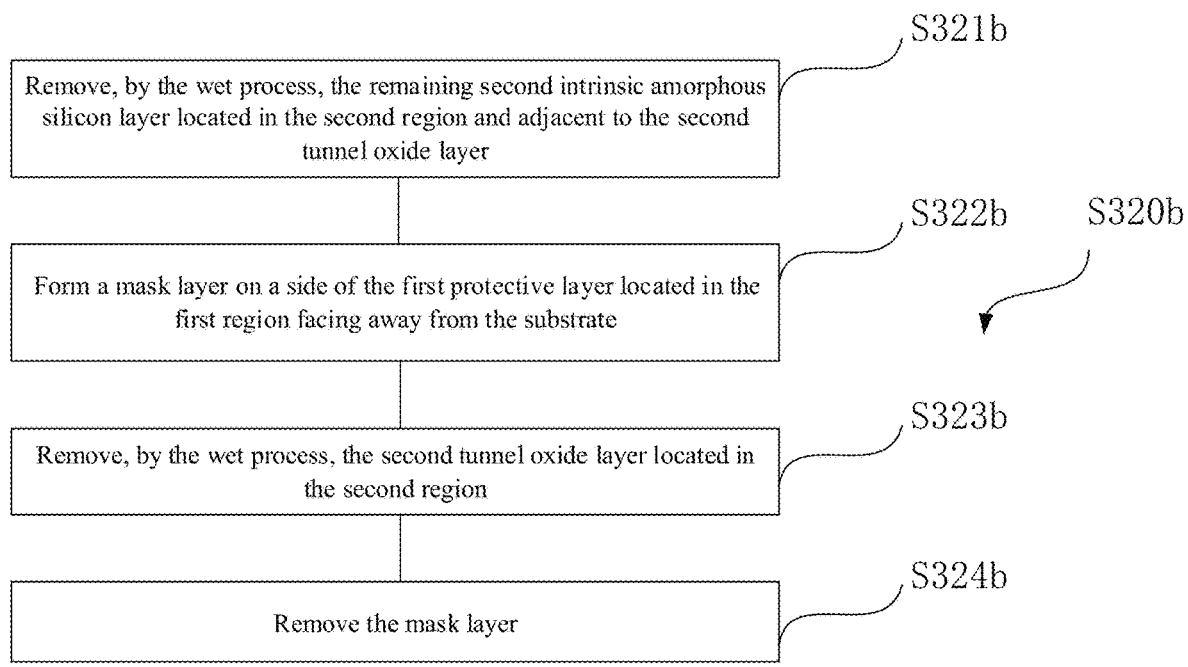
FIG. 4 is a first schematic flowchart of removing a second intrinsic amorphous silicon layer and a second tunnel oxide layer located in a second region in the manufacturing method for a solar cell according to some embodiments of the present disclosure.

As shown in FIG. 4, in some embodiments, step S320a specifically includes the following steps.

In S321a, the remaining second intrinsic amorphous silicon layer 150 located in the second region 112b and adjacent to the second tunnel oxide layer 140 are removed by the wet process.

Specifically, the remaining second intrinsic amorphous silicon layer 150 located in the second region 112b and adjacent to the second tunnel oxide layer 140 may be removed by a polishing additive. The polishing additive may not cause damage to the first protective layer 170 and the second tunnel oxide layer 140, thereby preventing damage of the polishing additive to the first intrinsic amorphous silicon layer 130 and the doping source layer 160.

In S322a, a mask layer is formed on a side of the first protective layer 170 located in the first region 112a facing away from the substrate 110.

Specifically, the mask layer may be a photoresist layer. The mask layer may protect the first protective layer 170 when the second tunnel oxide layer 140 located in the second region 112b is removed, ensuring no damage to the first protective layer 170, to facilitate subsequent diffusion.

In S323a, the second tunnel oxide layer 140 located in the second region 112b is removed by the wet process.

Specifically, the second tunnel oxide layer 140 may be removed by an acid solution. For example, the second tunnel oxide layer 140 may be removed by a hydrogen fluoride solution.

In S324a, the mask layer is removed.

It is to be noted that a thickness of the first protective layer 170 may range from 50 nm to 100 nm, a thickness of the second tunnel oxide layer 140 may range from 1 nm to 2 nm, and the thickness of the first protective layer 170 is greater than the thickness of the second tunnel oxide layer 140. If an etching process permits, there is no need to form the mask layer on the side of the first protective layer 170 located in the first region 112a facing away from the substrate. By controlling parameters of the etching process, when the second tunnel oxide layer 140 located in the second region 112b is removed, the damage to the first protective layer 170 is reduced as much as possible.

In some embodiments, step S4 specifically includes: at a preset temperature, doping, by the doping source layer 160, the first intrinsic amorphous silicon layer 130 and the second intrinsic amorphous silicon layer 150 with the first element for a preset duration, to obtain the first doped layer 130a and the second doped layer 130b respectively.

Specifically, the preset temperature may range from 850° C. to 1000° C., and the preset duration may range from 5 min to 25 min, which may be determined according to thicknesses of the first intrinsic amorphous silicon layer 130 and the second intrinsic amorphous silicon layer 150. For example, when the thickness of the first intrinsic amorphous silicon layer 130 is 50 nm and the thickness of the second intrinsic amorphous silicon layer 150 is 100 nm, the preset temperature may range from 890° C. to 920° C., and the preset duration may range from 8 min to 10 min.

The first intrinsic amorphous silicon layer 130 located in the second region is doped with the second element, to obtain the third doped layer 150a.

In this embodiment, the entire doping and diffusion process may be carried out in a same diffusion tube without changing tubes, which can improve diffusion efficiency and simplify a diffusion process. Due to the blocking effect of the first protective layer 170, contamination of the diffusion tube by the first element in the doping source layer 160 can be prevented, and when the first intrinsic amorphous silicon layer 130 located in the second region 112b is doped with the second element through the diffusion tube, the first protective layer 170 can prevent entry of the second element into the first intrinsic amorphous silicon layer 130 and the second intrinsic amorphous silicon layer 150 located in the first region 112a, thereby ensuring that doping types of the first doped layer 130a and the second doped layer 130b are the same. The doping types of the first doping layer 130a and the second doped layer 130b are different from a doping type of the third doped layer 150a, ensuring the passivation effect of the passivation contact structure formed on the substrate 110.

In some embodiments, subsequent to step S4, the method further includes removing the doping source layer 160 and the first protective layer 170.

Specifically, the doping source layer 160 and the first protective layer 170 may be removed by the wet process. The doping source layer 160 and the first protective layer 170 may be removed by an acid solution (e.g., HF acid).

Figure 5:
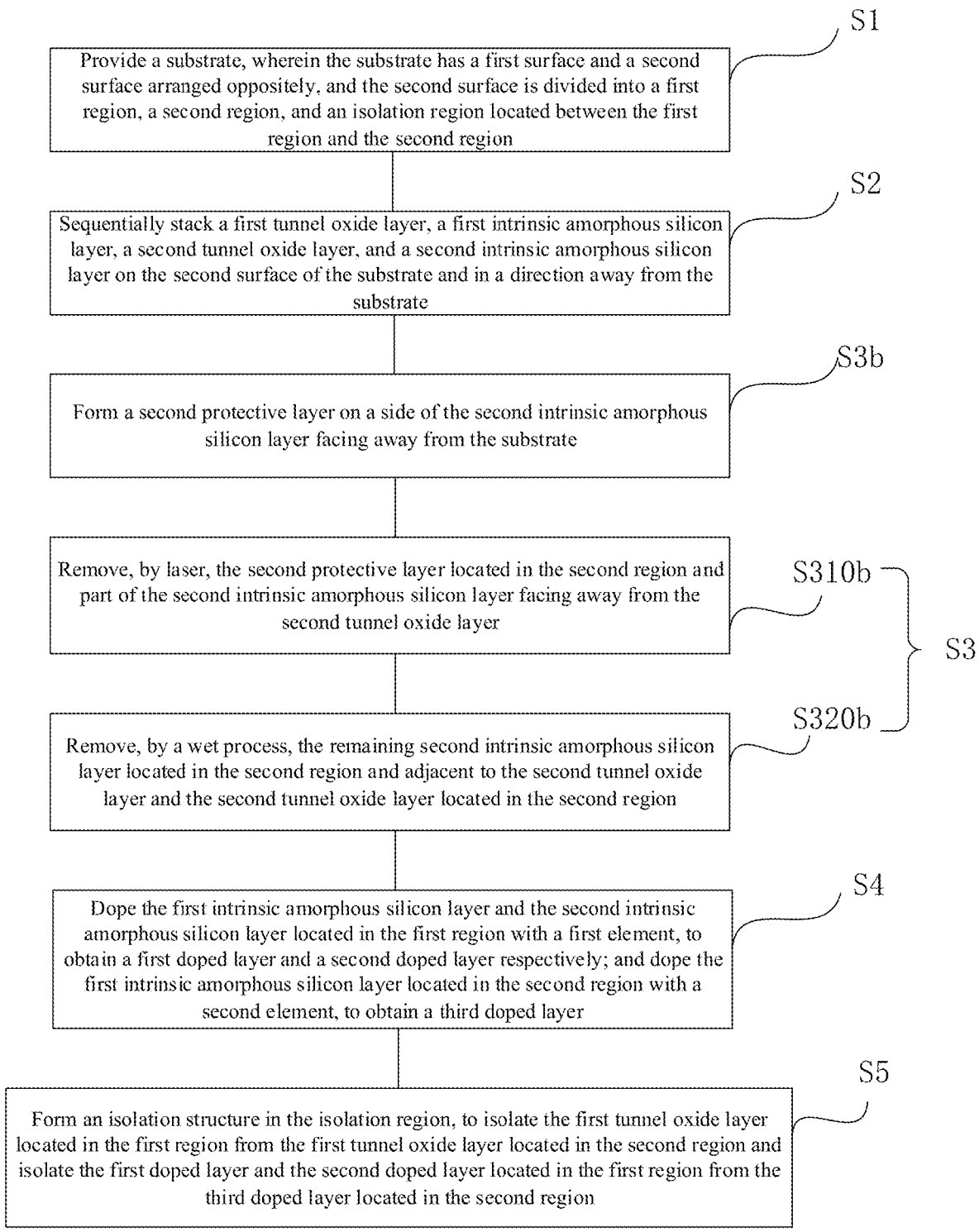
FIG. 5 is a second flowchart of the manufacturing method for a solar cell according to some embodiments of the present disclosure.
Figure 6:
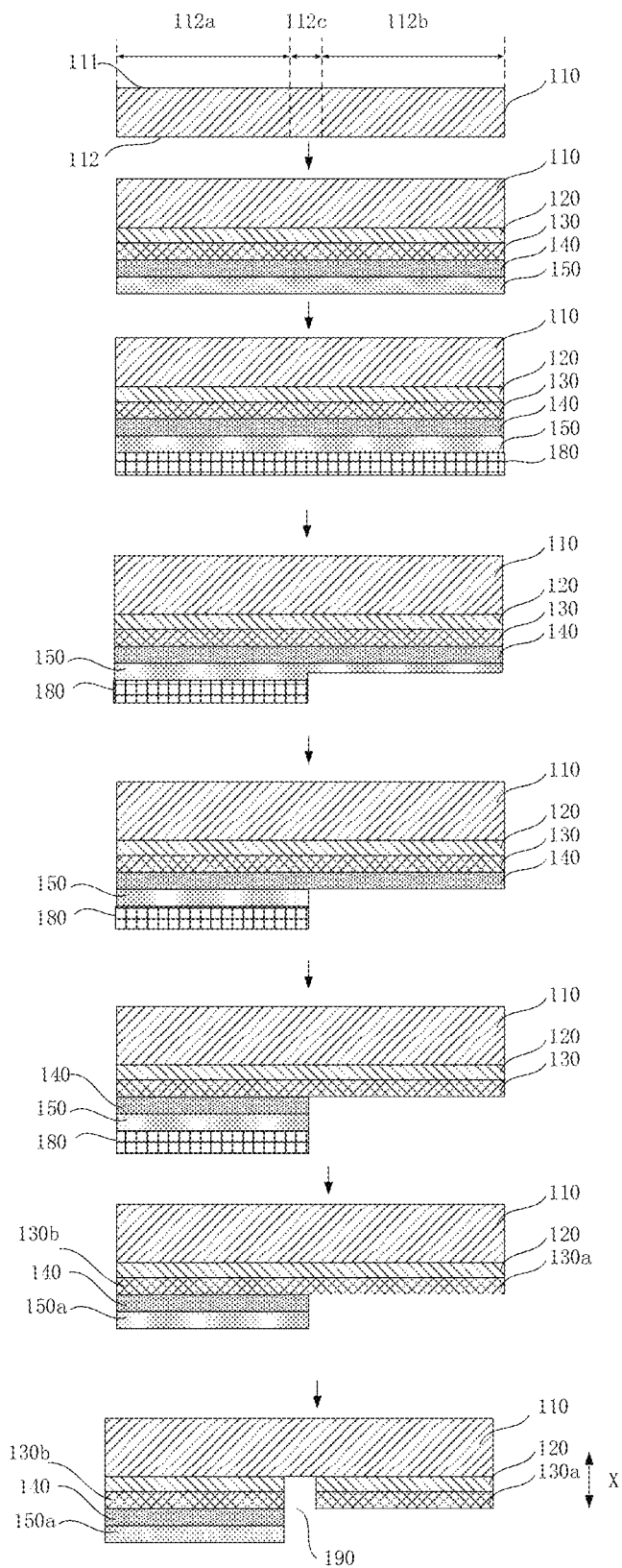
FIG. 6 is a second process flowchart corresponding to the second flowchart in FIG. 5.

Referring to FIG. 5 and FIG. 6 together, in some embodiments, prior to step S3, the method further includes the following step.

In S3b, a second protective layer 180 is formed on a side of the second intrinsic amorphous silicon layer 150 facing away from the substrate 110.

Specifically, the second protective layer 180 may be at least one of a silicon oxide layer, silicon oxynitride, and silicon nitride. The second protective layer 180 may be manufactured by a deposition method such as APCVD or PECVD. The second protective layer 180 is formed on the side of the second intrinsic amorphous silicon layer 150 facing away from the substrate 110, which can play a protective and blocking role in the subsequent manufacturing process. A thickness of the second protective layer 180 ranges from 50 nm to 100 nm.

Referring to FIG. 5 and FIG. 6 together, in some embodiments, step S3 specifically includes the following steps.

In S310b, the second protective layer 180 and part of the second intrinsic amorphous silicon layer 150 facing away from the second tunnel oxide layer 140 that are located in the second region 112b are removed by laser.

In S320b, the remaining second intrinsic amorphous silicon layer 150 located in the second region 112b and adjacent to the second tunnel oxide layer 140 and the second tunnel oxide layer 140 located in the second region 112b are removed by a wet process.

In this embodiment, the second protective layer 180 and part of the second intrinsic amorphous silicon layer 150 facing away from the second tunnel oxide layer 140 that are located in the second region 112b are removed by laser; and the remaining second intrinsic amorphous silicon layer 150 and the second tunnel oxide layer 140 located in the second region 112b are removed by the wet process. During the removal by laser, the second intrinsic amorphous silicon layer 150 serves as a sacrificial layer and can absorb laser energy, and the second tunnel oxide layer 140 can serve as a barrier layer, which can block transmission of laser energy and reduce damage of the laser to the first intrinsic amorphous silicon layer 130. The remaining second intrinsic amorphous silicon layer 150 and the second tunnel oxide layer 140 are removed by the wet process, which can prevent damage to the first intrinsic amorphous silicon layer 130, thereby ensuring performance of the third doped layer 150a obtained by doping and improving efficiency of the cell.

Figure 7:
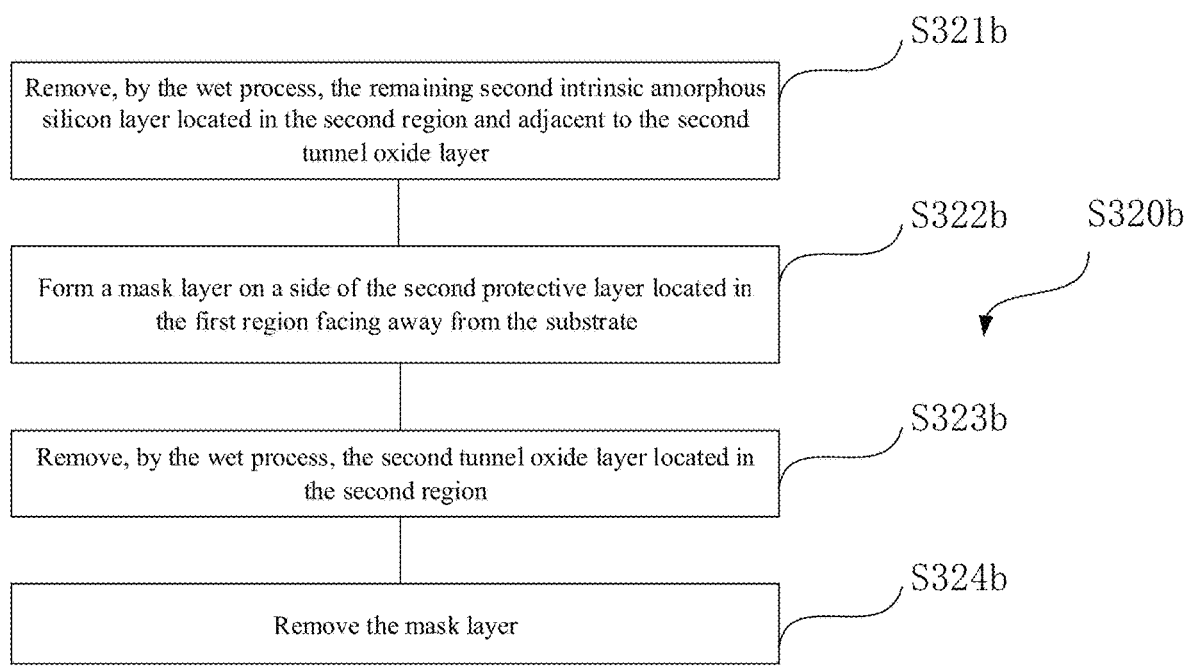
FIG. 7 is a second schematic flowchart of removing the second intrinsic amorphous silicon layer and the second tunnel oxide layer located in the second region in the manufacturing method for a solar cell according to some embodiments of the present disclosure.

As shown in FIG. 7, in some embodiments, step S320b specifically includes the following steps.

In S321b, the remaining second intrinsic amorphous silicon layer 150 located in the second region 112b and adjacent to the second tunnel oxide layer 140 are removed by the wet process.

Specifically, the remaining second intrinsic amorphous silicon layer 150 located in the second region 112b and adjacent to the second tunnel oxide layer 140 may be removed by a polishing additive. The polishing additive may not cause damage to the second protective layer 180 and the second tunnel oxide layer 140, thereby preventing damage of the polishing additive to the first intrinsic amorphous silicon layer 130.

In S322b, a mask layer is formed on a side of the second protective layer 180 located in the first region 112a facing away from the substrate 110.

Specifically, the mask layer may be a photoresist layer. The mask layer may protect the second protective layer 180 when the second tunnel oxide layer 140 located in the second region 112b is removed, ensuring no damage to the second protective layer 180, to facilitate subsequent diffusion.

In S323b, the second tunnel oxide layer 140 located in the second region 112b is removed by the wet process.

Specifically, the second tunnel oxide layer 140 may be removed by an acid solution. For example, the second tunnel oxide layer 140 may be removed by a hydrogen fluoride solution.

In S324b, the mask layer is removed.

It is to be noted that a thickness of the second protective layer 180 may range from 50 nm to 100 nm, a thickness of the second tunnel oxide layer 140 may range from 1 nm to 2 nm, and the thickness of the second protective layer 180 is greater than the thickness of the second tunnel oxide layer 140. If an etching process permits, there is no need to form the mask layer on the side of the second protective layer 180 located in the first region facing away from the substrate. By controlling parameters of the etching process, when the second tunnel oxide layer 140 located in the second region is removed, the damage to the second protective layer 180 is reduced as much as possible.

In some embodiments, step S4 specifically includes: doping the first intrinsic amorphous silicon layer 130 located in the second region 112b with the second element, to obtain the third doped layer 150a; forming a third protective layer on a side of the third doped layer 150a facing away from the substrate 110; and removing the second protective layer 180 located in the first region 112a, and doping the first intrinsic amorphous silicon layer 130 and the second intrinsic amorphous silicon layer 150 located in the first region 112a with the first element, to obtain the first doped layer 130a and the second doped layer 130b.

In this embodiment, during the doping of the first intrinsic amorphous silicon layer 130 located in the second region 112b with the second element, the second protective layer 180 plays a blocking role to prevent diffusion of the second element to the first intrinsic amorphous silicon layer 130 and the second intrinsic amorphous silicon layer 150 located in the first region 112a. The third protective layer is formed on the side of the third doped layer 150a facing away from the substrate 110, and the third protection layer may play a blocking role, which can prevent diffusion of the first element to the third doped layer 150a, thereby ensuring that doping types of the first doped layer 130a and the second doped layer 130b are the same. The doping types of the first doped layer 130a and the second doped layer 130b are different from a doping type of the third doped layer 150a, ensuring the passivation effect of the passivation contact structure formed on the substrate 110.

Further, the third protective layer may be at least one of a silicon oxide layer, silicon oxynitride, and silicon nitride. The second protective layer 180 may be manufactured by a deposition method such as APCVD or PECVD.

In some embodiments, subsequent to step S4, the method further includes removing the third protective layer.

Specifically, the third protective layer may be removed by the wet process.

Figure 8:
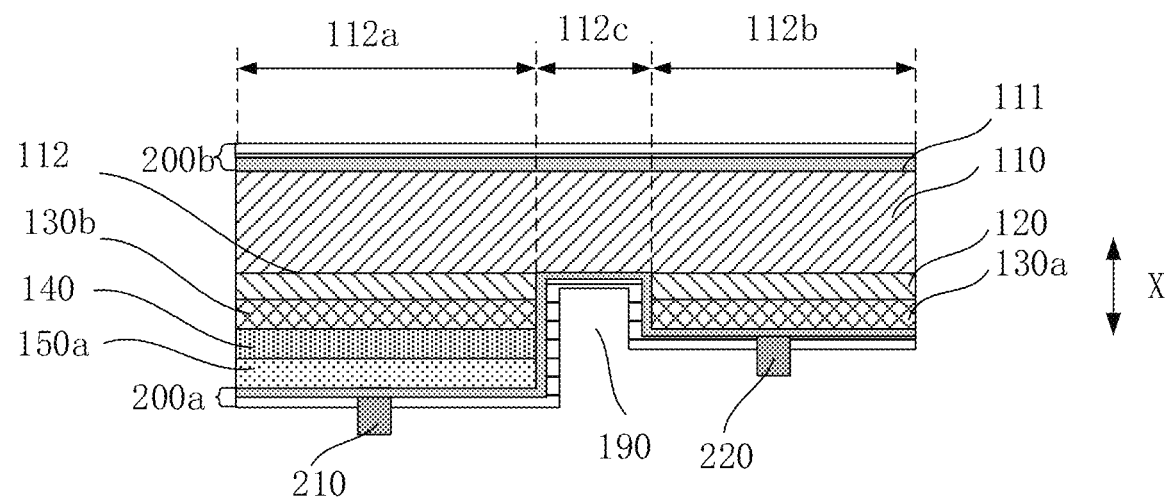
FIG. 8 is a schematic structural diagram of a solar cell according to some embodiments of the present disclosure.

As shown in FIG. 8, in some embodiments, subsequent to step S5, the method further includes: forming a first passivation antireflection layer 200a on the side of the second doped layer 130b and the third doped layer 150a facing away from the substrate 100, the first passivation antireflection layer 200a covering at least a surface on the side of the second doped layer 130b and the third doped layer 150a facing away from the substrate 100; and forming a second passivation antireflection layer 200b on the first surface of the substrate 110.

Further, both the first passivation antireflection layer 200a and the second passivation antireflection layer 200b may be at least one of aluminum oxide, silicon nitride, silicon oxide, gallium oxide, aluminum nitride, and silicon oxynitride. The first passivation antireflection layer 200a and the second passivation antireflection layer 200b may be formed simultaneously.

In some embodiments, the method further includes: forming a first electrode 210 on a side of the first passivation antireflection layer 200a located in the first region facing away from the substrate 110, the first electrode 210 being connected to the second doped layer 130b; and forming a second electrode 220 on a side of the first passivation antireflection layer 200a located in the second region facing away from the substrate 110, the second electrode 220 being connected to the third doped layer 150a.

In some embodiments, thicknesses of the first tunnel oxide layer 120 and the second tunnel oxide layer 140 both range from 1 nm to 2 nm; and thicknesses of the first doped layer 130a, the second doped layer 130b, and the third doped layer 150a all range from 50 nm to 500 nm.

As shown in FIG. 8, an embodiment of a second aspect of the present disclosure provides a solar cell, including: a substrate 110 having a first surface 111 and a second surface 112 arranged oppositely; the second surface 112 including a first region 112a, a second region 112b, and an isolation region 112c located between the first region and the second region; a first tunnel oxide layer 120, a first doped layer 130a, a second tunnel oxide layer 140, and a second doped layer 130b located in the first region 112a and sequentially stacked in a direction away from the substrate 110; the first tunnel oxide layer 120 and a third doped layer 150a located in the second region 112b and sequentially stacked in a direction away from the substrate 110; and an isolation structure 190 located in the isolation region 112c, the isolation structure 190 being configured to isolate the first tunnel oxide layer 120 located in the first region 112a from the first tunnel oxide layer 120 located in the second region 112b, and the isolation structure being further configured to isolate the first doped layer 130a and the second doped layer 130b located in the first region 112a from the third doped layer 150a located in the second region 112b.

The solar cell in the embodiments of the present disclosure may be manufactured with the manufacturing method, which may lead to low cell manufacturing costs, facilitate mass production of the cell, and reduce mass production costs of the cell. In addition, doping concentration of the first doped layer 130a may be less than doping concentration of the second doped layer 130b, thereby reducing parasitic absorption of light by the first doped layer 130a, improving efficiency of the cell, improving an ohmic contact effect between the second doped layer 130b and the electrodes, and improving efficiency and reliability of the cell. In addition, the second tunnel oxide layer 140 can reduce recombination, and at the same time, the second tunnel oxide layer 140 has a certain reflection effect on light, thereby improving light utilization and further improving the efficiency of the cell.

In some embodiments, the isolation structure 190 includes an isolation groove, the isolation groove runs through the first tunnel oxide layer 120, the first doped layer 130a, the second tunnel oxide layer 140, the second doped layer 130b, and the third doped layer 150a along a first direction X, and the first direction X is perpendicular to a plane where the substrate 110 is located. In this way, the first tunnel oxide layer 120 located in the first region 112a can be isolated from the first tunnel oxide layer 120 located in the second region 112b, and the first doped layer 130a and the second doped layer 130b located in the first region 112a can be isolated from the third doped layer 150a located in the second region 112b, so as to prevent recombination and improve efficiency of the cell.

An embodiment of a third aspect of the present disclosure provides a photovoltaic module, including the solar cell described in any one of the above embodiments in the second aspect, thereby improving efficiency of the photovoltaic module.

An embodiment of a fourth aspect of the present disclosure provides a photovoltaic system, including the photovoltaic module described in any one of the above embodiments in the third aspect, thereby improving efficiency of the photovoltaic module.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the concept of the present disclosure, and these all fall within the protection scope of the present disclosure. Therefore, the patent protection scope of the present disclosure should be subject to the appended claims.

The invention claimed is:

1. A manufacturing method for a solar cell, comprising:
providing a substrate, wherein the substrate has a first surface and a second surface arranged oppositely, and the second surface includes a first region, a second region, and an isolation region located between the first region and the second region;
sequentially stacking a first tunnel oxide layer, a first intrinsic amorphous silicon layer, a second tunnel oxide layer, and a second intrinsic amorphous silicon layer on the second surface of the substrate and in a direction away from the substrate, wherein each of the first tunnel oxide layer, the first intrinsic amorphous silicon layer, the second tunnel oxide layer, and the second intrinsic amorphous silicon layer is partially located in each of the first region, the second region and the isolation region;
removing the second intrinsic amorphous silicon layer and the second tunnel oxide layer located in the second region;
doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer; and
forming an isolation structure in the isolation region, to isolate the first tunnel oxide layer located in the first region from the first tunnel oxide layer located in the second region and isolate the first doped layer and the second doped layer located in the first region from the third doped layer located in the second region.

2. The manufacturing method for the solar cell according to claim 1, further comprising:
prior to the removing the second intrinsic amorphous silicon layer and the second tunnel oxide layer located in the second region,
sequentially stacking a doping source layer and a first protective layer on a side of the second intrinsic amorphous silicon layer facing away from the substrate, wherein the doping source layer is configured to provide the first element required for doping.

3. The manufacturing method for the solar cell according to claim 2, wherein the removing the second intrinsic amorphous silicon layer and the second tunnel oxide layer located in the second region, specifically comprises:
removing, by laser, the first protective layer, the doping source layer, and part of the second intrinsic amorphous silicon layer facing away from the second tunnel oxide layer that are located in the second region; and
removing, by a wet process, the remaining second intrinsic amorphous silicon layer located in the second region and adjacent to the second tunnel oxide layer and the second tunnel oxide layer located in the second region.

4. The manufacturing method for the solar cell according to claim 3, wherein the removing, by a wet process, the remaining second intrinsic amorphous silicon layer located in the second region and adjacent to the second tunnel oxide layer and the second tunnel oxide layer located in the second region, specifically comprises:
removing, by the wet process, the remaining second intrinsic amorphous silicon layer located in the second region and adjacent to the second tunnel oxide layer;
forming a mask layer on a side of the first protective layer located in the first region facing away from the substrate;

removing, by the wet process, the second tunnel oxide layer located in the second region; and removing the mask layer.

5. The manufacturing method for the solar cell according to claim 3, wherein the doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer, specifically comprises:

at a preset temperature, doping, by the doping source layer, the first intrinsic amorphous silicon layer and the second intrinsic amorphous silicon layer with the first element for a preset duration, to obtain the first doped layer and the second doped layer respectively; and doping the first intrinsic amorphous silicon layer located in the second region with the second element, to obtain the third doped layer.

6. The manufacturing method for the solar cell according to claim 5, further comprising: subsequent to the doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer, removing the doping source layer and the first protective layer.

7. The manufacturing method for the solar cell according to claim 1, further comprising: prior to the removing the second intrinsic amorphous silicon layer and the second tunnel oxide layer located in the second region, forming a second protective layer on a side of the second intrinsic amorphous silicon layer facing away from the substrate.

8. The manufacturing method for the solar cell according to claim 7, wherein the removing the second intrinsic amorphous silicon layer and the second tunnel oxide layer located in the second region, specifically comprises:

removing, by laser, the second protective layer located in the second region and part of the second intrinsic amorphous silicon layer facing away from the second tunnel oxide layer; and removing, by a wet process, the remaining second intrinsic amorphous silicon layer located in the second region and adjacent to the second tunnel oxide layer and the second tunnel oxide layer located in the second region.

9. The manufacturing method for the solar cell according to claim 8, wherein the removing, by a wet process, the remaining second intrinsic amorphous silicon layer located in the second region and adjacent to the second tunnel oxide layer and the second tunnel oxide layer located in the second region, specifically comprises:

removing, by the wet process, the remaining second intrinsic amorphous silicon layer located in the second region and adjacent to the second tunnel oxide layer;

forming a mask layer on a side of the second protective layer located in the first region facing away from the substrate;

removing, by the wet process, the second tunnel oxide layer located in the second region; and removing the mask layer.

10. The manufacturing method for the solar cell according to claim 8, wherein the doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer, specifically comprises:

doping the first intrinsic amorphous silicon layer located in the second region with the second element, to obtain the third doped layer;

forming a third protective layer on a side of the third doped layer facing away from the substrate; and removing the second protective layer located in the first region, and doping the first intrinsic amorphous silicon layer and the second intrinsic amorphous silicon layer located in the first region with the first element, to obtain the first doped layer and the second doped layer.

11. The manufacturing method for the solar cell according to claim 10, further comprising: subsequent to the doping the first intrinsic amorphous silicon layer and the second intrinsic amorphous silicon layer located in the first region with a first element, to obtain a first doped layer and a second doped layer respectively; and doping the first intrinsic amorphous silicon layer located in the second region with a second element, to obtain a third doped layer, removing the third protective layer.

12. The manufacturing method for the solar cell according to claim 1, further comprising: subsequent to the forming an isolation structure in the isolation region, to isolate the first tunnel oxide layer located in the first region from the first tunnel oxide layer located in the second region and isolate the first doped layer and the second doped layer located in the first region from the third doped layer located in the second region, forming a first passivation antireflection layer on a side of the second doped layer and the third doped layer facing away from the substrate, the first passivation antireflection layer covering at least a surface on the side of the second doped layer and the third doped layer facing away from the substrate; and forming a second passivation antireflection layer on the first surface of the substrate.

13. The manufacturing method for the solar cell according to claim 12, further comprising:

forming a first electrode on a side of the first passivation antireflection layer located in the first region facing away from the substrate, the first electrode being connected to the second doped layer; and forming a second electrode on a side of the first passivation antireflection layer located in the second region facing away from the substrate, the second electrode being connected to the third doped layer.

14. The manufacturing method for the solar cell according to claim 1, wherein thicknesses of the first tunnel oxide layer and the second tunnel oxide layer both range from 1 nm to 2 nm; and thicknesses of the first doped layer, the second doped layer, and the third doped layer all range from 50 nm to 500 nm.

* * * * *